United States Patent
Kapusta et al.

(10) Patent No.: US 8,748,754 B2
(45) Date of Patent: Jun. 10, 2014

(54) SYSTEM AND METHOD OF FORMING A PATTERNED CONFORMAL STRUCTURE

(75) Inventors: Christopher James Kapusta, Delanson, NY (US); Donald Paul Cunningham, Dallas, TX (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/301,941

(22) Filed: Nov. 22, 2011

(65) Prior Publication Data

US 2012/0069523 A1    Mar. 22, 2012

Related U.S. Application Data

(62) Division of application No. 12/263,874, filed on Nov. 3, 2008.

(51) Int. Cl.
    H05K 9/00           (2006.01)

(52) U.S. Cl.
    USPC .................... 174/350; 174/356; 361/816

(58) Field of Classification Search
    USPC ....... 174/35 R, 350, 351, 352, 353, 354, 355, 174/356, 357, 358, 359, 386, 387, 377, 174/384; 361/818, 816, 820; 257/659
    See application file for complete search history.

(56) References Cited

U.S. PATENT DOCUMENTS

| | | | |
|---|---|---|---|
| 4,399,487 A | 8/1983 | Neumann | |
| 5,043,526 A * | 8/1991 | Nakagawa et al. | 174/250 |
| 5,166,864 A | 11/1992 | Chitwood et al. | |
| 5,177,324 A | 1/1993 | Carr et al. | |
| 5,341,274 A * | 8/1994 | Nakatani et al. | 174/394 |
| 5,557,064 A | 9/1996 | Isern-Flecha et al. | |
| 5,557,142 A | 9/1996 | Gilmore et al. | |
| 5,639,989 A | 6/1997 | Higgins, III | |
| 5,696,196 A * | 12/1997 | DiLeo | 524/445 |
| 5,867,371 A | 2/1999 | Denzene et al. | |
| 6,055,160 A | 4/2000 | Schmidt et al. | |
| 6,110,563 A | 8/2000 | Pienimaa et al. | |
| 6,121,553 A | 9/2000 | Shinada et al. | |
| 6,134,121 A | 10/2000 | Braxton | |
| 6,157,548 A | 12/2000 | Collins et al. | |
| 6,316,734 B1 | 11/2001 | Yang | |
| 6,455,770 B2 | 9/2002 | Pulver | |
| 6,504,095 B1 | 1/2003 | Hoffstrom | |
| 6,566,596 B1 | 5/2003 | Askew | |
| 6,674,652 B2 | 1/2004 | Forte et al. | |

(Continued)

OTHER PUBLICATIONS

Definition of "individualize" from www.merriam-webster.com, Oct. 29, 2013.*

Primary Examiner — Chau N Nguyen
Assistant Examiner — Roshn Varghese
(74) Attorney, Agent, or Firm — Ziolkowski Patent Solutions Group, SC; Jean K. Testa

(57) ABSTRACT

A system and method of forming a patterned conformal structure for an electrical system is disclosed. The conformal structure includes a dielectric coating shaped to conform to a surface of an electrical system, with the dielectric coating having a plurality of openings therein positioned over contact pads on the surface of the electrical system. The conformal structure also includes a patterned conductive coating layered on the dielectric coating and on the contact pads such that an electrical connection is formed between the patterned conductive coating and the contact pads. The patterned conductive coating comprises at least one of an interconnect system, a shielding structure, and a thermal path.

17 Claims, 6 Drawing Sheets

(56) References Cited

U.S. PATENT DOCUMENTS

| | | |
|---|---|---|
| 6,717,485 B2 * | 4/2004 | Kolb et al. .................... 174/377 |
| 6,822,823 B1 | 11/2004 | Tsuwako et al. |
| 6,909,615 B2 | 6/2005 | Arnold et al. |
| 7,009,106 B2 | 3/2006 | DiPoala |
| 7,161,092 B2 | 1/2007 | Glovatsky |
| 7,196,275 B2 | 3/2007 | Babb et al. |
| 7,202,422 B2 | 4/2007 | Ogatsu |
| 7,214,889 B2 | 5/2007 | Mazurkiewicz |
| 7,248,484 B2 | 7/2007 | Brooks et al. |
| 7,358,447 B2 | 4/2008 | Gabower |
| 7,443,899 B2 | 10/2008 | Ueki |
| 7,445,968 B2 * | 11/2008 | Harrison et al. ............. 438/124 |
| 7,733,659 B2 | 6/2010 | Snider et al. |
| 7,752,751 B2 | 7/2010 | Kapusta et al. |
| 7,839,647 B2 | 11/2010 | Lee et al. |
| 7,952,881 B2 | 5/2011 | Magana et al. |
| 8,004,860 B2 | 8/2011 | Salzman |
| 8,035,976 B2 | 10/2011 | Snider et al. |
| 8,087,165 B2 | 1/2012 | Snider et al. |
| 8,115,117 B2 | 2/2012 | Kapusta et al. |
| 8,154,884 B2 | 4/2012 | Lin |
| 8,156,644 B2 | 4/2012 | Babb et al. |
| 2002/0104669 A1 * | 8/2002 | Underwood et al. ....... 174/35 R |
| 2006/0014317 A1 | 1/2006 | Farnworth et al. |
| 2006/0152913 A1 | 7/2006 | Richey et al. |
| 2008/0055878 A1 * | 3/2008 | Salzman ....................... 361/818 |
| 2009/0002972 A1 * | 1/2009 | Carey et al. .................. 361/818 |
| 2009/0302437 A1 * | 12/2009 | Kim et al. .................... 257/659 |

* cited by examiner

SYSTEM AND METHOD OF FORMING A PATTERNED CONFORMAL STRUCTURE

CROSS REFERENCE TO RELATED APPLICATIONS

The present application is a divisional of and claims priority to U.S. Ser. No. 12/263,874 filed on Nov. 3, 2008, the disclosure of which is incorporated herein.

BACKGROUND OF THE INVENTION

Embodiments of the invention relate generally to conformal coatings and, more particularly, to a method and apparatus for forming a patterned conformal structure for an electrical system.

Technological advancements in the area of electronic devices have experienced vast growth in recent years. For example, while cellular phones are becoming smaller and lighter, their features and capabilities are simultaneously expanding. This has caused an increase in the complexity and operation of the electrical components found in such devices and a decrease in the amount of space available for such components. Several challenges arise from such an increase in complexity of the electrical components and decrease in the amount of space available. For example, based on space limitations, circuit boards are reduced in size to an extent that the routing density for the board may be constrained and limited below a desired amount. As every layer of the circuit board increases the thickness thereof, the number of layers implemented must be controlled and minimized. The reduction in size of the circuit board also leads to increased congestion on the circuit board such that it is difficult to connect component input/output (IO).

The decreased amount of space available also poses a challenge with respect to radio frequency and electromagnetic interference (i.e., RFI and EMI) between components. That is, many electronic components radiate electromagnetic radiation, which may cause interference with other electrical devices and detrimentally affect the performance and operation of those electrical devices. As a result, shields have been used to prevent such components from causing such interference. The most common RFI/EMI shields are box-type shields comprised of a single piece of folded or stamped metal (i.e., metal cans, metal foil claddings, etc.) contoured to fit over a PC board. Space must be allocated on the circuit board to accommodate these box-type shields, which reduces the space available for other components. That is, conventional box-type shields are bulky and take up a great deal of space and volume, a majority of which is an unused air gap between the circuit board and the shield. This can add to the overall thickness of an electronic device (e.g., a cellular phone). Additionally, a product may have many components requiring RFI/EMI shielding from other components within the product as well as from external sources. Depending on the number of the shields needed, significant weight and cost may be added to the product.

Therefore, it would be desirable to design an interconnect and routing system that decreases routing density and congestion on the circuit board. It is further desired to design a low profile, low weight, high performance RFI/EMI shield that is reduced in size.

BRIEF DESCRIPTION OF THE INVENTION

Embodiments of the invention overcome the aforementioned drawbacks by providing a patterned conformal structure for an electrical system, and method of manufacturing thereof, that provides for additional interconnect and routing functionality and/or adequate shielding of the circuit board from RF and/or EM interference.

In accordance with one aspect of the invention, a conformal structure includes a dielectric coating shaped to conform to a surface of an electrical system, with the dielectric coating having a plurality of openings therein positioned over contact pads on the surface of the electrical system. The conformal structure also includes a patterned conductive coating layered on the dielectric coating and on the contact pads such that an electrical connection is formed between the patterned conductive coating and the contact pads. The patterned conductive coating comprises at least one of an interconnect system, a shielding structure, and a thermal path.

In accordance with another aspect of the invention, a method of forming a patterned conformal structure includes the steps of applying a conformal insulating coating to an electrical system and forming a plurality of openings in the insulating coating at desired locations. The method also includes the step of forming a conformal patterned metallic layer on a portion of the insulating coating and in each of the plurality of openings, the conformal patterned metallic layer being electrically connected with the electrical system at the desired locations.

In accordance with yet another aspect of the invention, a method of forming a conformal interconnect system includes the steps of applying an electrically insulative coating to a circuit board and forming an opening in the electrically insulative coating adjacent to each of a plurality of contact pads on the circuit board. The method also includes the step of forming a patterned conductive layer on the electrically insulative coating and in the opening adjacent to each of the plurality of contact pads, the patterned conductive layer comprising an interconnect system electrically coupled to the circuit board at the plurality of contact pads.

These and other advantages and features will be more readily understood from the following detailed description of preferred embodiments of the invention that is provided in connection with the accompanying drawings.

DETAILED DESCRIPTION OF THE PREFERRED EMBODIMENT

The present invention provides a patterned conformal shielding and interconnect arrangement or structure. The arrangement is described as being conformal because it is formed to conform or adapt to the shape of the article that it is applied to. While described below with respect to use with a printed circuit board (PCB), it is envisioned that the conformal shielding and interconnect arrangement/structure of the invention may be used in conjunction with other electrical systems and electronic devices.

Figure 1:
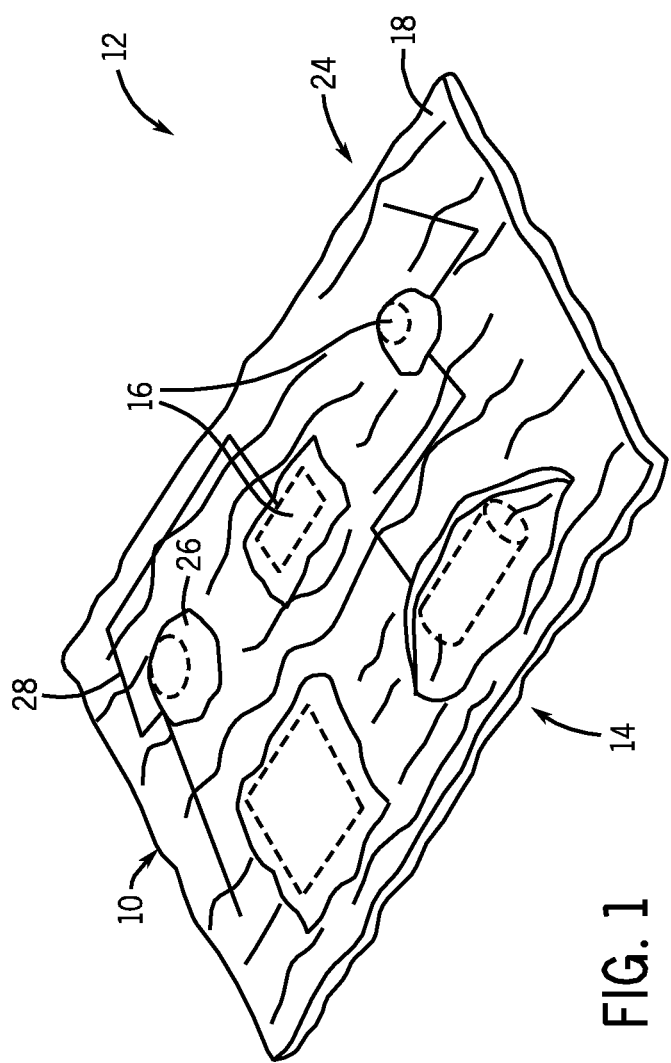
FIG. 1 is a perspective view of a patterned conformal structure formed on a populated printed circuit board according to an embodiment of the invention.

Referring to FIG. 1, a perspective view of a patterned conformal structure 10 is shown in accordance with the invention. The patterned conformal structure 10 forms part of a circuit assembly 12, together with a circuit substrate 14, such as a printed circuit board (PCB), flex PCB, rigid flex PCB, or multi-chip module, with circuit components 16 disposed on the circuit substrate 14. The patterned conformal structure 10 is disposed on the circuit substrate 14 and circuit components 16 so as to conform about the components and at least a portion of the circuit substrate. According to an embodiment of the invention, the resulting patterned conformal structure 10 provides localized shielding to circuit assembly 12 by selectively shielding individual circuit components 16. While described for use with a circuit substrate 14 and circuit components 16, it is also envisioned that patterned conformal structure 10 could be positioned over other electrical systems sensitive to RF and EM interference. According to another embodiment of the invention, patterned conformal structure 10 provides interconnects and routing for circuit assembly 12 on a separate plane from circuit substrate 14, with the interconnects/routing functioning as electrical and/or thermal pathways in circuit assembly 12.

The patterned conformal structure 10 includes therein a dielectric layer 18 and a patterned metallic layer 24 that provides protection to the circuit components 16 from internally- and externally-sourced interfering elements, as well as provides electrical interconnects and thermal pathways for circuit assembly 12. That is, patterned conformal structure 10 includes therein localized grounded shielding structures 26 that protect circuit components 16 from radio frequency (RF) interference, electromagnetic (EM) interference, electrostatic discharge, and environmental elements such as moisture, dust, and environmental contaminants. The localized grounded shielding structures 26 of patterned conformal structure 10 conform to each circuit component 16 such that each component 16 is individually protected and shielded from potential interference from the other components 16 of the circuit assembly 12. In addition to providing localized shielding to selective components 16, the patterned conformal structure 10 also includes interconnects 24. As will be described in greater detail below, interconnects 24 provide electrical routing in a separate dimensional plane from that of the circuit substrate 14 and/or can also provide thermal pathways for improved heat dissipation in circuit assembly 12.

Figure 2:
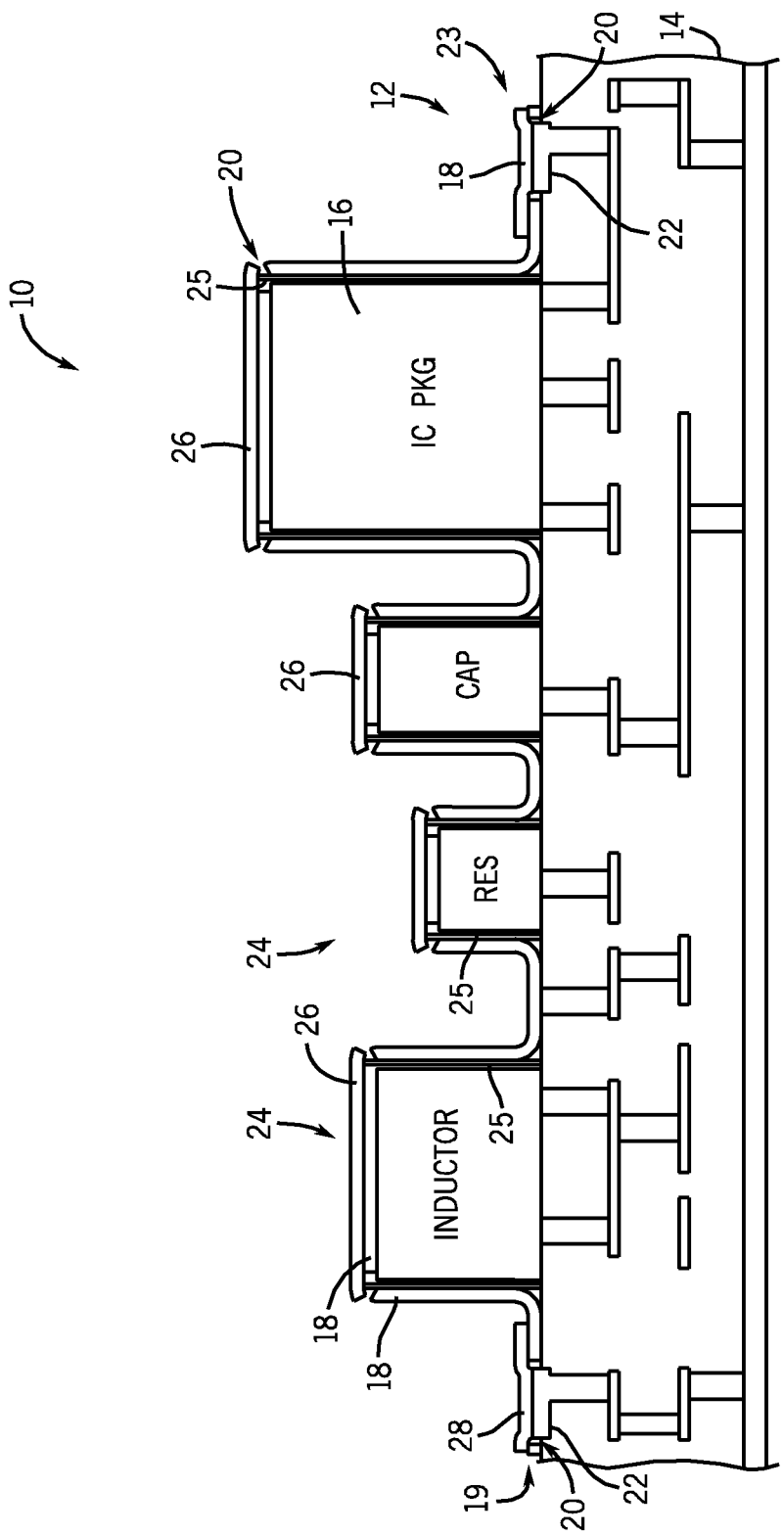
FIG. 2 is a cross-sectional view of a patterned conformal structure according to an embodiment of the invention.

Referring now to FIG. 2, a cross-sectional view of circuit assembly 12 and patterned conformal structure 10 is shown, in accordance with an embodiment of the invention. The patterned conformal structure 10 is formed from a conformable material that can be adapted to the shape of the circuit substrate 14 and the circuit components 16 (e.g., resistors, integrated circuit packages, capacitors, inductors, etc.) upon which it is disposed. The patterned conformal structure 10 includes a dielectric layer or coating 18 (i.e., electrically insulating layer) that is positioned adjacent to and formed over a top surface 19 of circuit substrate 14 and the circuit components 16 positioned thereon. The dielectric layer 18 makes contact with the circuit components 16 so as to help protect the components and other portions of the circuitry on the circuit substrate 14 from electrical shorts. The dielectric layer 18 can be formed of any electrically insulating material that can be made to conform to the shape of the circuit assembly 12, and in one embodiment, comprises an ultraviolet (UV) curable polymer such as, for example, a UV light curing conformal coating by Dymax Corp. It is also envisioned, however, that other suitable epoxy coatings or silicon-based coatings could also be used to form dielectric layer 18. In depositing dielectric layer 18 on circuit assembly 12, a spray coating process can be employed. Such an application process provides a controllable and reproducible depositing of dielectric coating 18 on circuit assembly 12, allowing for control of the thickness of the dielectric layer. It is also envisioned, however, that a dip coating process can be used to deposit dielectric layer 18 on circuit assembly 12, or that dielectric layer 18 could be applied and shaped by way of a thermo-forming process. Importantly, the deposition of dielectric coating 18 on circuit assembly 12 via one of the above techniques results in a coating having a uniform thickness and that is pinhole-free.

A plurality of openings 20 are formed in dielectric coating 18 to expose contact pads 22 located on circuit substrate 14 and, according to one embodiment, expose thru silicon vias 25 extending up from circuit substrate 14 and/or components 16. Exposing of contact pads 22 and thru silicon vias 25 allows for electrical coupling of the patterned conformal structure 10 to a ground plane 23 of the circuit substrate 14, as will be explained in greater detail below. In an exemplary embodiment, openings 20 are formed by way of a laser ablation process. That is, a laser is directed to points on dielectric coating above contact pads 22 and thru silicon vias 25, so as to ablate/burn any dielectric material positioned thereover. Alternatively, it is also envisioned that a masking layer (not shown) can be applied over contact pads 22 before depositing of the dielectric layer 18. The masking layer can then be removed after deposition of the dielectric layer 18, thus providing an opening through the dielectric layer to expose contact pads 22. It is recognized that the exposing of contact pads 22 also allows for a manufacturer to test the circuit assembly 12 after forming dielectric layer 18.

A patterned, electrically conductive layer 24 is formed on top of the dielectric layer 18 after the dielectric layer has been allowed to cure and after formation of openings 20. The patterned electrically conductive layer 24 is comprised of an electrically and thermally conductive material and, according to an exemplary embodiment, can be formed of a metallic material such as copper, silver, or nickel, for example, so as to provide localized RF and EM shielding to the circuit assembly 12 and serve as electrical interconnects and thermal pathways in the circuit assembly 12. While referenced here below as a patterned metallic layer 24, it is also envisioned that other suitable materials could also be used to form the patterned layer, such as a metal impregnated epoxy or metal-filled paint, and it is to be understood that the term patterned metallic layer encompasses such variations and equivalents. It is also envisioned that patterned metallic layer 24 could be formed of multiple layers (not shown) to provide better adhesion between the patterned metallic layer 24 and dielectric layer 18 (e.g., a titanium layer adjacent to the dielectric layer and a copper layer on the titanium layer) and improved shielding characteristics. As shown in FIG. 2, the patterned metallic layer 24 is discontinuous (i.e., not a single integral, continuous layer), such that it does not cover an entirety of the dielectric layer 18. Rather, patterned metallic layer 24 is formed via a patterning process to form localized shielding structures 26 for components 16 of the circuit assembly 12 and/or interconnects 28 routed along the dielectric layer 18. As shown in FIG. 2, each of the shielding structures 26 are electrically connected to ground through the openings 20 and thru silicon vias 25 in order to provide shielding and an electrical/thermal pathway with circuit substrate 14. The shielding structures 26 can provide a high heat conductivity thermal plane for conductive or convection cooling of the circuit assembly 12, with the through silicon vias 25 acting as thermal conductors from the circuit substrate 14 or components 16 to the shielding structures 26. Additionally, interconnects 28 are electrically connected to circuit substrate 14 and/or components 16 to provide electrical routing in circuit assembly 12 on a plurality of different planes and/or to provide thermal pathways in the circuit assembly 12.

According to one embodiment of the invention, patterned metallic layer 24 is formed by way of an additive technique. That is, metallic material (e.g., copper, silver, or nickel) is applied via one of several techniques, such as an adhesive process (i.e., spray, spin, or dip coating process) or an electrostatic process, onto dielectric layer 18 at locations where it is desired to form patterned metallic layer 24. A masking material/layer can be applied to dielectric layer 18 prior to adhesive/electrostatic coating of the metallic material and then subsequently removed, thus allowing for the forming and defining of shielding structures 26 and/or interconnects 28 on the dielectric layer 18. Alternatively, a seed metal could be applied to dielectric layer 18 at locations where it is desired to form patterned metallic layer 24. A thermally conductive metal, such as for example copper, silver, or nickel, could then be added (e.g., electroplated) at those locations to form and define shielding structures 26 and/or interconnects 28 on the dielectric layer 18.

Figure 3A:
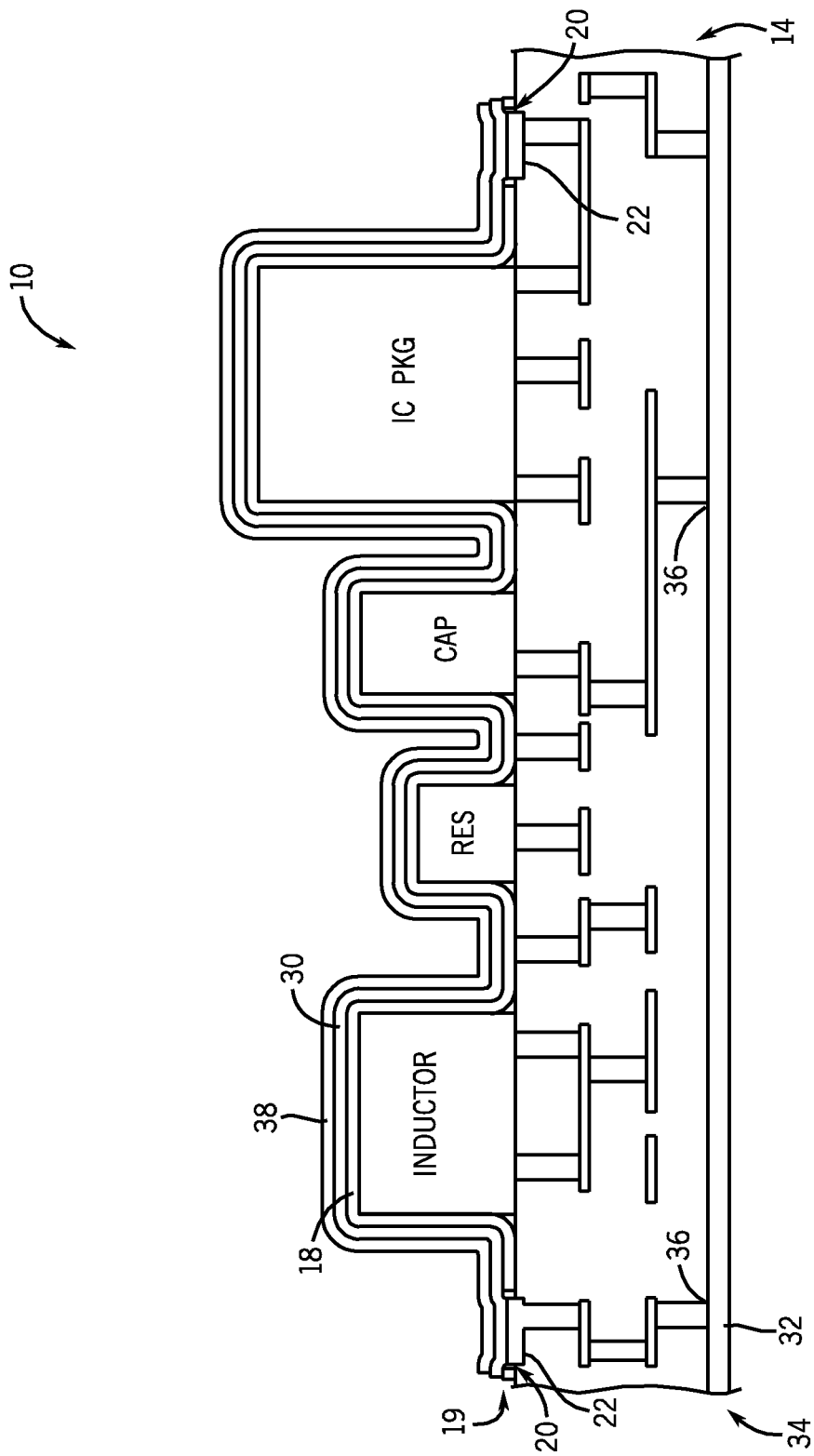
FIGS. 3A and 3B are cross-sectional views of a patterned conformal structure at various steps of manufacturing according to an embodiment of the invention.

According to another embodiment of the invention, patterned metallic layer 24 is formed by way of an additive/subtractive photolithography technique. As shown in FIG. 3A, a continuous metallic layer 30 is applied to dielectric layer 18 via one of several known metal deposition techniques. In one embodiment, metallic layer 30 is applied by an electroless plating process, although it is envisioned that a sputtering or evaporative coating process could also be employed. Thus, it is recognized that metallic layer 30 can be formed as a metallic particulate coating. In addition to being deposited over dielectric layer 18, metallic layer 30 is also deposited in openings 20 so as to form an electrical connection with contact pads 22. This electrical connection between metallic layer 30 and contact pads 22 provides for coupling of the patterned conformal structure 10 to the circuit substrate 14 and provides enhanced shielding to reduce RF emissions entering or leaving protected areas. The metallic layer 30 is deposited on dielectric layer 18 such that it has at least a minimal thickness so as to provide uniform and complete metal coverage (e.g., 1-2 kA), and provides adequate RF and EM shielding of circuit assembly 12. While shown in FIG. 3A as being formed as a single layer via a single application of a metallic material, it is also recognized that metallic layer 30 could be formed by a two-step process. That is, a thin first metallic layer could be added via one of the deposition techniques set forth above, and then a second metallic layer can applied to the first metallic layer to increase the thickness of the overall metallic layer 30, thus providing improved shielding in patterned conformal structure 10. The second metallic layer could be comprised of an electrically conductive metal, such as copper, silver, or nickel, or another suitable material and can be deposited on first metallic layer via an electroplating process, although it is also envisioned that an additional electroless plating, sputtering, or evaporative coating process could also be employed.

It is also envisioned that, during formation of patterned conformal structure 10, a protective layer 32 (e.g., a photoresist layer) can be applied to a back surface 34 of circuit substrate 14. That is, prior to application of metallic layer 30, such as through an electroless plating process, protective layer 32 can be applied to back surface 34 of circuit substrate 14. Application of protective layer 32 eliminates metallization of contacts 36 or backside components that might occur during a subsequent application of metallic layer 30. After application of metallic layers 30, protective layer 32 may be removed to re-expose contacts 36 on the back surface 34.

Referring still to FIG. 3A, after application of the metallic layer 30 via either of the one-step or two-step application processes described above, a photoresist layer 38 is applied on the metallic layer 30. The photoresist layer 38 can be applied via one of several techniques, including dip coating or spray coating, and electrophoritic resist coating, such as with a Shipley Eagle 2100® photoresist. The photoresist layer 38 can be either of a positive resist or a negative resist and, according to an embodiment of the invention, is photo patterned, such as be use of a photomask (not shown). The photoresist layer 38 is photo patterned to define thereon shield areas, interconnect areas, and thermal pathways that are desired to be formed from the conformal metallic layer 30. That is, according to embodiments of the invention, shielding areas can be defined to selectively cover/shield components 16 on the circuit substrate 14 and/or interconnects and thermal pathways can be defined to be routed along the dielectric layer 18.

Figure 3B:
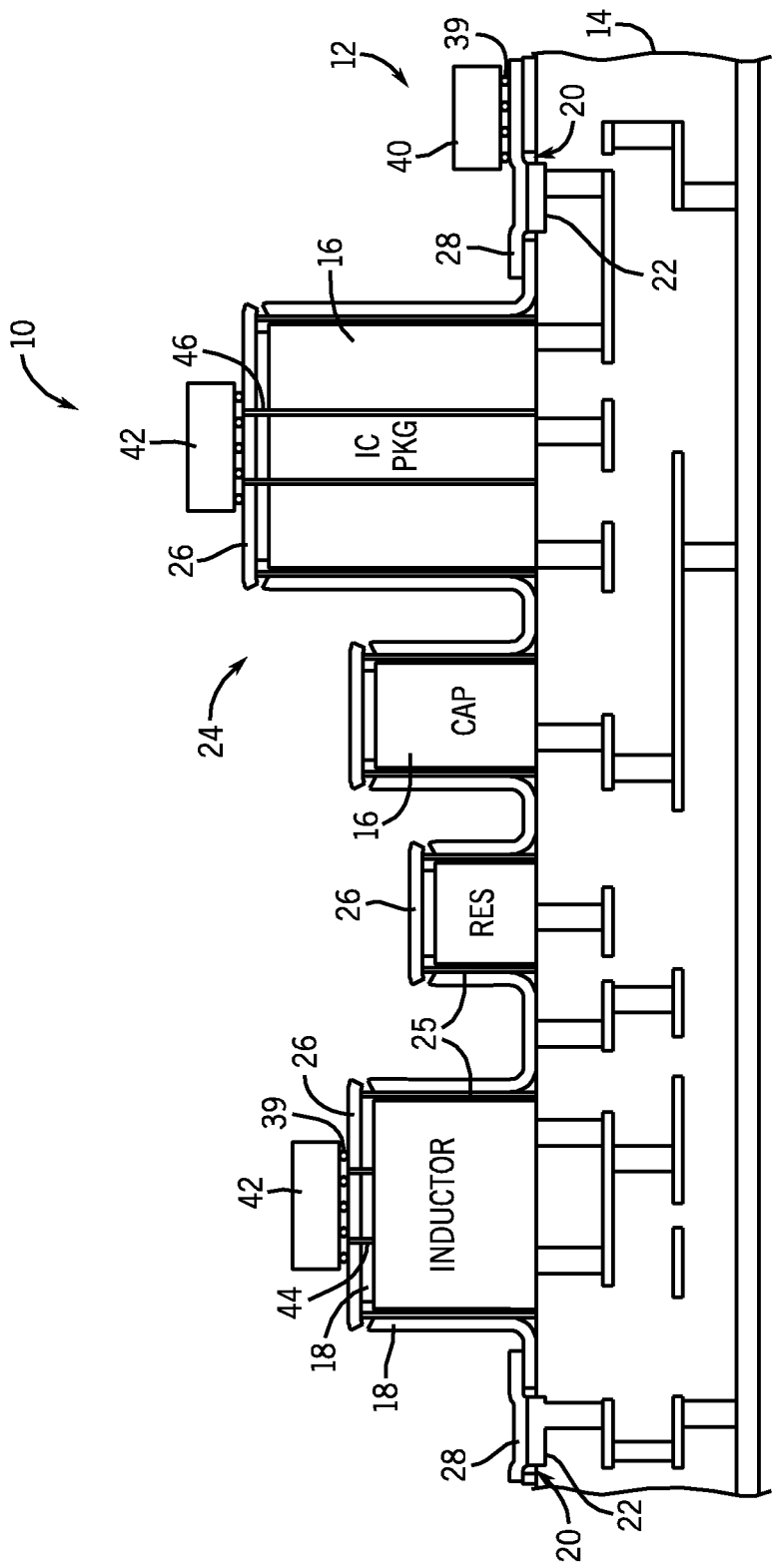

Portions of the photo resist layer 38 are removed/dissolved, such as by way of a suitable photo resist developer, to selectively expose portions of the metallic layer 30. Referring now to FIG. 3B, according to an embodiment of the invention, the exposed areas of the metallic layer 30 are then etched to form a patterned conformal metallic layer 24. The remaining photo resist 38 (FIG. 3A), which was insoluble to the photo resist developer based on the photo patterning, is then removed/stripped to expose the remaining portions of the metallic layer that were not etched away. The resulting patterned metallic layer 24 is thus in the form of a discontinuous layer, and can include therein shield portions 26 (i.e., shielding areas) and electrical routing or interconnects 28. Beneficially, the selective formation of shield portions 26 allows for faraday cages to be formed about components 16 on the circuit substrate 14. Additionally, formation of the electrical routing/interconnects 28 provides for routing in a separate dimensional plane from that of the circuit substrate 14. This allows for a high-density interconnect system to be formed in which an increased amount of interconnects are provided than would be able to be routed on the circuit substrate 14 alone.

According to an embodiment of the invention, and as shown in FIG. 3B, the electrical routing/interconnects 28 of the conformal, patterned metallic layer can be formed to include solder pads and/or wirebonds 39 for stacking surface mount soldered functional components 40 and surface mount packages 42, which can include passives such as capacitors, resistors, inductors, and/or semiconductor packages. Surface mount soldered functional components 40 can be applied/connected directly to the patterned metallic layer 24, and electrically connected to the circuit board 14 by way of openings 20 (i.e., laser drilled vias). Additionally surface mount packages 42 can be "stacked" onto components 16 of the circuit assembly 12 so as to form a three dimensional (3D) stack of surface mount components. According to one embodiment of the invention, package feed thrus 44 are formed through the dielectric layer 18 and patterned metallic layer 24, such as through a shield portion 26, to connect a component 16 to a surface mount package 42. Additionally, thru-silicon vias 46 extending through a component 16 could connect the surface mount package 42 directly to the circuit substrate 14 (i.e. die). The conformal, patterned metallic layer 24 thus provides a platform for package stacking, which can greatly reduce circuit substrate 14 area required, as well as provide more direct component-to-component connection outside of the circuit substrate 14.

Figure 4:
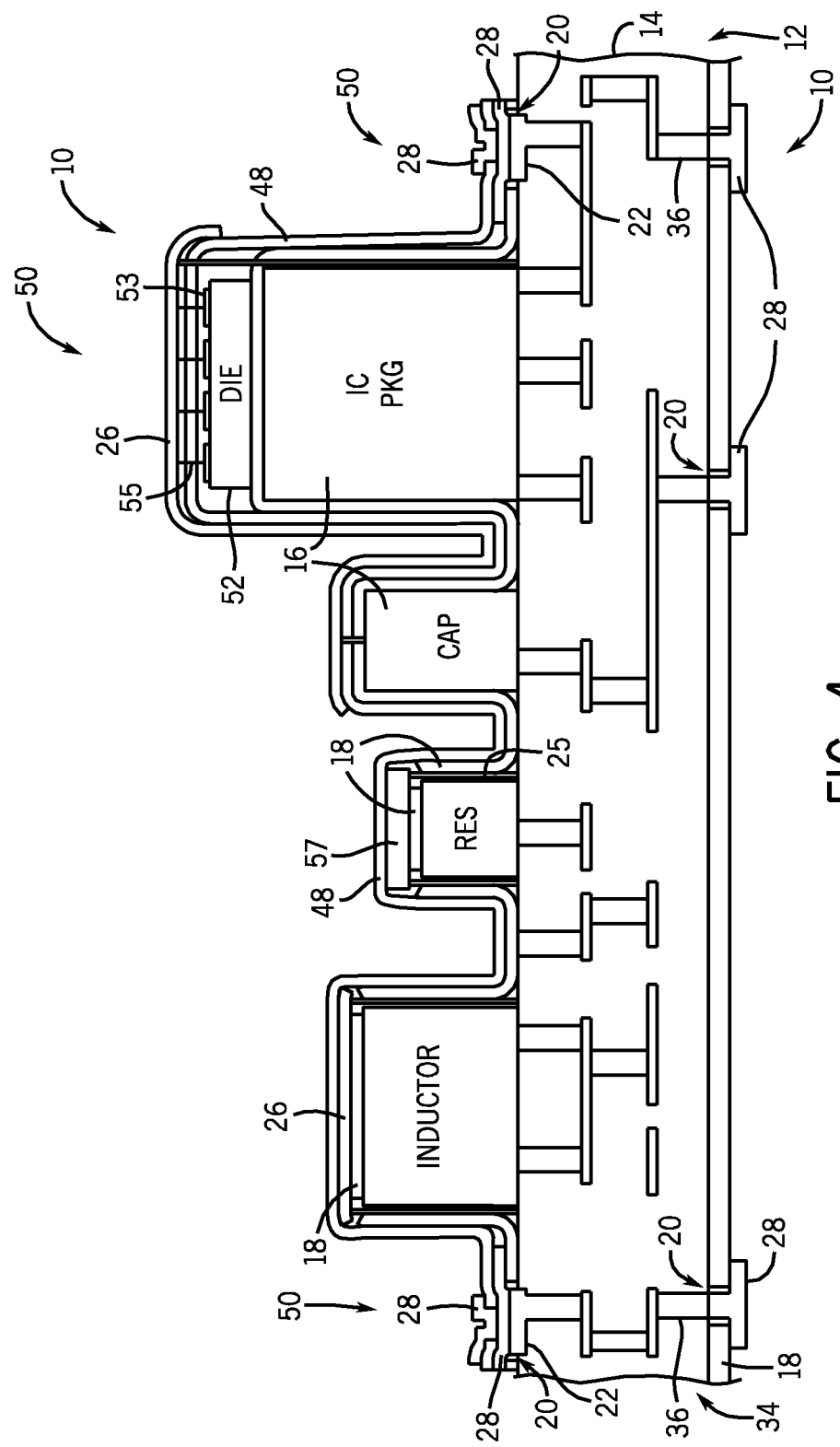
FIG. 4 is a cross-sectional view of a multi-layered patterned conformal structure according to an embodiment of the invention.

Referring now to FIG. 4, it is recognized that additional dielectric layers 18 and conformal patterned metallic layers 24 can be included in patterned conformal structure 10. As shown in FIG. 4, a secondary dielectric layer 48 is applied onto patterned metallic layer 24. A plurality of openings 20 are formed in secondary dielectric layer 48 at locations that expose the patterned metallic layer 24. For example, openings 20 can be formed at locations directly above/adjacent to interconnects 28 of the patterned metallic layer 24. A secondary patterned metallic layer 50 is then formed on secondary dielectric layer 48 by way of one of the additive/subtractive processes described above with respect to FIGS. 2 and 3A/3B. In an exemplary embodiment, the secondary patterned metallic layer 50 is formed/patterned such that it includes interconnects 28 that intersect with, and are electrically connected to, interconnects 28 of patterned metallic layer (by way of openings 20), and subsequently to ground plane 23 of the circuit substrate 14. While shown as including only a secondary dielectric layer 48 and secondary patterned metallic layer 50, it is recognized that a plurality of additional dielectric and patterned metallic layers could be further applied and formed.

As further shown in FIG. 4, according to an embodiment of the invention, a patterned conformal structure 10 is also added to back surface 34 of circuit substrate 14. A dielectric layer 18 is applied to the back surface 34, and a plurality of openings 20 are formed therein to expose contacts 36 located on circuit substrate 14. A patterned metallic layer 24 is then formed on dielectric layer 18, as described above with respect to FIG. 2 or 3A/3B.

Also shown in FIG. 4 is an embedded die 52 (i.e., 3D embedded die layer) that is included in patterned conformal structure 10. According to an embodiment of the invention, the embedded die 52 is applied to dielectric layer 18. As shown in FIG. 4, embedded die 52 is stacked on top of a component 16 of circuit assembly 12, although it is also envisioned that embedded die 52 could be placed on dielectric layer 18 at a location directly above circuit substrate 14. The embedded die 52 is electrically insulated from component 16 by dielectric layer 18 and includes thereon pads 53 from which wires 55 extend therefrom to provide an electrical connection. Wires 55 can extend through secondary dielectric layer 48 to provide an electrical (and thermal) connection to secondary patterned metallic layer 50, which in turn is electrically connected to components 16 and/or circuit substrate 14 of circuit assembly 12.

It is recognized that other additional devices can be included in patterned conformal structure 10. For example, a device 57 is shown in FIG. 4 as being positioned on dielectric layer 18. According to embodiments of the invention, the device 57 can comprise an RF antennae a thin film passive device (e.g., capacitor, resistor, inductor, etc.), or a printed circuit board (PCB) structure or embedded chip build-up (ECBU) structure. The structure/design of device 57 will vary based on its specific application, and it is understood that the listed devices are exemplary, and that device 57 also is understood to encompass or equivalent or similar devices.

Upon completion of patterned conformal structure(s) 10, the circuit assembly 12 can be inserted into the end product (e.g., cellular phone) and tested to determine if the assembly is functioning properly. Beneficially, if circuit assembly 12 fails this functionality test, the assembly can be removed from the product and the patterned conformal structure 10 removed so as to allow for reworking of the circuit assembly. That is, as distinguished from prior art box-type shields, patterned conformal structure 10 allows for testing of circuit assembly 12 after formation of the shield on the circuit assembly. More specifically, patterned metallic layer(s) 24 can be removed via an etching process and the dielectric layer 18 removed, such that the circuit assembly 12 can then be repaired/reworked. To protect backside contacts 36 during such an etching/removal process, protective layer 32 can be reapplied before initiation of the etching and removal of the patterned metallic layer 24 and dielectric layer 18.

Figure 5:
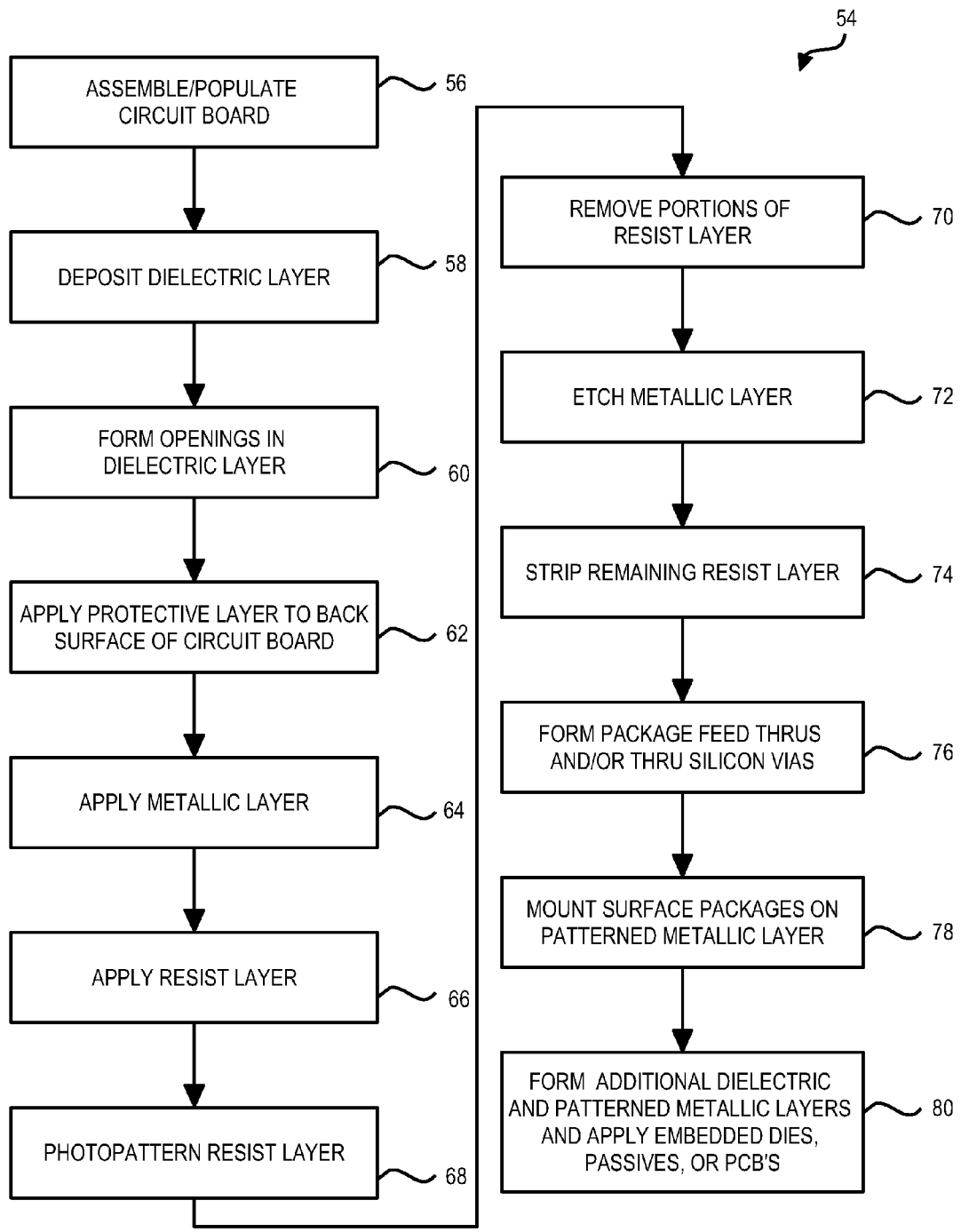
FIG. 5 is a flow chart of a process for manufacturing a patterned conformal structure according to an embodiment of the invention.

Referring to FIG. 5, an exemplary process for manufacturing a patterned conformal structure and circuit assembly is set forth, according to an embodiment of the invention. The process 54 begins with assembly of a circuit board and the population of circuit components thereon, as shown at STEP 56. A dielectric layer is deposited on a front surface of the circuit assembly at STEP 58, such as via a spray coating or dip coating process. Preferably, the dielectric layer comprises a UV curable polymer, to allow for quick curing thereof (e.g., within 3-5 seconds).

Subsequent to deposition of the dielectric layer, a plurality of openings are formed in the dielectric coating at STEP 60 to expose contact pads located on the front surface of the circuit board. Exposing of contact pads allows for electrical coupling of the conformal shield to, for example, a ground plane of the circuit board. In an exemplary process, the openings in the dielectric layer are formed by way of a laser ablation process. Alternatively, it is also envisioned that a masking layer can be applied over the contact pads before depositing of the dielectric layer. The masking layer can be removed after deposition of the dielectric layer, thus providing an opening through the dielectric layer to expose the contact pads.

According to one embodiment of the invention, upon formation of the openings, a protective layer is applied to a back surface of the circuit board at STEP 62. The protective layer can be composed of, for example, a spray-on material or a photoresist material that can be easily applied and removed and hold up to plating chemistry. Subsequent to application of the protective layer, a metallic layer is applied to the dielectric coating and exposed contact pads within the openings formed in the dielectric coating, at STEP 64. The metallic layer includes an electrically conductive metal, such as copper, gold, nickel, or another suitable material that provides RF shielding to the circuit assembly, and is applied via an electroless plating, sputtering, or evaporative coating process. The metallic layer can thus comprise a metallic particulate coating. Depositing of the metallic layer in openings of the dielectric layer allows for formation of an electrical connection between the metallic layer and the contact pads. In an embodiment of the invention, this electrical connection provides for grounding of the conformal shield to the circuit board.

It is recognized that the metallic layer can be applied via a single deposition process, or alternatively, via a number of distinct deposition processes. That is, a thin metallic layer could be applied via one of the techniques described above, and a second subsequent step can be performed to thicken the thin metallic layer and provide the conformal shield with improved RF and EM shielding characteristics. The second deposition step could, for example, be in the form of an electroplating process that increases the overall thickness of the metallic layer to, for example, 2 to 5 micrometers.

Upon application of the metallic layer, a resist layer is applied at STEP 66 to coat the metallic layer. The resist layer is applied by one of several techniques, including dip coating, spray coating, lamination, or electrophoritic resist coating, such as with a Shipley Eagle 2100® photoresist. The photoresist layer can be either of a positive resist or a negative resist.

A photopatterning of the resist layer is performed at STEP 68, such as by way of a photomask, to define thereon shield areas, interconnect areas, and thermal pathways that are desired to be formed from the conformal metallic layer. That is, shielding areas can be defined to selectively cover/shield components on the electrical device and/or interconnects and thermal pathways can be defined to be routed along the dielectric layer, by way of photopatterning.

Portions of the photo resist layer are removed/dissolved at STEP 70, such as by way of a suitable photo resist developer, to selectively expose portions of the metallic layer. The exposed areas of the metallic layer are then etched at STEP 72 to form a discontinuous, patterned conformal metallic layer. As set forth above, shield areas, interconnect areas, and thermal pathways can be formed in the patterned metallic layer. The remaining photo resist, which was insoluble to the photo resist developer based on the photo patterning, is then removed/stripped at STEP 74 to expose the remaining portions of the metallic layer that were not etched away.

While STEPS 64-74 describe a photolithograpy and etching process for forming the patterned metallic layer, it is also recognized that the patterned metallic layer could be formed by an additive process, according to another embodiment of the technique for manufacturing a patterned conformal structure and circuit assembly. That is, a seed metal can be applied to dielectric layer at locations where it is desired to form patterned metallic layer. A thermally conductive metal, such as for example copper, silver, or nickel, can then be added at those locations to form and define shielding structures and/or interconnects on the dielectric layer.

According to an embodiment of the invention, upon formation of the patterned metallic layer, package feed thrus and/or thru-silicon vias can be formed at STEP 76 to allow for mounting of surface packages to the electrical device. That is, according to one embodiment of the invention, package feed thrus can be formed through the dielectric layer and into the patterned metallic layer to provide a connection between a surface mount package and a face of the circuit board component. Additionally, thru-silicon vias can be formed thru circuit board components to allow for a direct connection between a surface mount package and the circuit board. After formation of the package feed thrus and/or thru-silicon vias, surface packages are mounted on the patterned metallic layer at STEP 78. The surface packages can be in the form of capacitors, resistors, inductors, and/or semiconductor packages.

In a next step in the manufacturing technique 54, and according to an embodiment of the invention, additional dielectric layers and patterned metal layers can be applied/formed at STEP 80. That is, at STEP 80 a secondary dielectric layer can applied onto the patterned metallic layer, a plurality of openings formed thereon to expose the patterned metallic layer, and a secondary patterned metallic layer formed on the secondary dielectric layer. The secondary patterned metallic layer is formed such that it includes interconnects that are electrically connected to interconnects of the previously formed patterned metallic layer, so as to form a multi-layer patterned conformal structure. Additionally, structures such as embedded dies, RF antennae, thin film passive devices, and/or PCBs can also be applied at STEP 80. Such devices can be applied after deposition of the secondary dielectric layer and prior to application/formation of the secondary patterned metallic layer. Such devices can be electrically connected to the components and/or circuit substrate of the circuit assembly by way of feed thru package vias or thru silicon vias.

While the above technique 54 of forming the patterned conformal structure 10 is described with respect to the front surface of a printed circuit board populated with circuit components, other embodiments are also envisioned. That is, it is recognized that the conformal shield could be formed on a back surface of the circuit board instead of, or in addition to, being formed on the front surface. Additionally, it is recognized that the conformal shield could be formed on a circuit board without circuit components thereon.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

Therefore, according to one embodiment of the invention, a conformal structure includes a dielectric coating shaped to conform to a surface of an electrical system, with the dielectric coating having a plurality of openings therein positioned over contact pads on the surface of the electrical system. The conformal structure also includes a patterned conductive coating layered on the dielectric coating and on the contact pads such that an electrical connection is formed between the patterned conductive coating and the contact pads. The patterned conductive coating comprises at least one of an interconnect system, a shielding structure, and a thermal path.

According to another embodiment of the invention, a method of forming a patterned conformal structure includes the steps of applying a conformal insulating coating to an electrical system and forming a plurality of openings in the insulating coating at desired locations. The method also includes the step of forming a conformal patterned metallic layer on a portion of the insulating coating and in each of the plurality of openings, the conformal patterned metallic layer being electrically connected with the electrical system at the desired locations.

According to yet another embodiment of the invention, a method of forming a conformal interconnect system includes the steps of applying an electrically insulative coating to a circuit board and forming an opening in the electrically insulative coating adjacent to each of a plurality of contact pads on the circuit board. The method also includes the step of forming a patterned conductive layer on the electrically insulative coating and in the opening adjacent to each of the plurality of contact pads, the patterned conductive layer comprising an interconnect system electrically coupled to the circuit board at the plurality of contact pads.

What is claimed as new and desired to be protected by Letters Patent of the United States is:

1. A conformal structure comprising:
   a dielectric coating shaped to conform to a surface of an electrical system having a plurality of circuit components mounted thereon, the dielectric coating having a plurality of openings therein positioned over contact pads on the surface of the electrical system; and
   a patterned conductive coating layered on the dielectric coating and on the contact pads such that an electrical connection is formed between the patterned conductive coating and the contact pads, the patterned conductive coating comprising:

an interconnect system electrically connected with a ground plane of the electrical system by way of a direct metallic connection to the contact pads; and a plurality of shielding structures configured to protect the circuit components from radio frequency (RF) interference and electromagnetic (EM) interference, wherein each of the plurality of shielding structures is formed over a respective one of the plurality of circuit components so as to conform to the respective circuit component;

wherein each of the plurality of shielding structures is separate from others of the plurality of shielding structures such that the plurality of shielding structures are formed discontinuous from one another and such that the plurality of shielding structures do not cover an entirety of the dielectric coating; and at least one thru silicon via structure extending out from the surface of the electrical system and extending out through the dielectric coating and into the patterned conductive coating.

2. The conformal structure of claim 1 wherein the electrical system comprises one of a printed circuit board (PCB), a flex PCB, a rigid flex PCB, and a module.

3. The conformal structure of claim 2 further comprising a surface mount package positioned on the patterned metallic coating, the surface mount package being electrically connected to one of the patterned conductive coating and the circuit components by the package feed-through structure or the thru silicon via structure.

4. The conformal structure of claim 3 wherein the surface mount package comprises one of a capacitor, a resistor, an inductor, and a semiconductor package.

5. The conformal structure of claim 1 further comprising:
a secondary dielectric coating positioned on the patterned conductive coating and configured to conform thereto, the secondary dielectric coating having at least two openings therein positioned over the patterned conductive coating; and a secondary patterned conductive coating layered on the secondary dielectric coating and on the patterned conductive coating at locations corresponding to the at least two openings in the secondary dielectric coating, such that an electrical connection is formed between the secondary patterned conductive coating and the patterned conductive coating;

wherein the dielectric coating, patterned conductive coating, secondary dielectric coating, and secondary patterned conductive coating form a multi-layer interconnect system on the electrical system to provide additional planes of component interconnect, shielding, or power and ground planes.

6. The conformal structure of claim 5 further comprising at least one of an embedded die, an RF antennae, and a thin film passive device positioned on the dielectric coating, wherein the at least one of the embedded die, the RF antennae, and the thin film passive device is electrically connected to at least one of the electrical system and a circuit component of the electrical system by way of the secondary patterned conductive coating and a thru silicon via structure.

7. The conformal structure of claim 1 wherein the surface of the electrical system comprises at least one of a front surface having circuit components mounted thereon and a back surface.

8. The conformal structure of claim 1 wherein the patterned conductive coating is composed of one of a metal impregnated epoxy and a metal-filled paint.

9. The conformal structure of claim 1 wherein the dielectric coating extends between adjacent shielding structures without any conductive coating applied thereon.

10. A patterned conformal structure comprising:
a dielectric coating shaped to conform to a surface of an electrical system having a plurality of circuit components mounted thereon, the dielectric coating having a uniform thickness and including a plurality of openings therein positioned over contact pads on the surface of the electrical system; and a patterned conductive coating layered on the dielectric coating and on the contact pads such that an electrical connection is formed between the patterned conductive coating and the contact pads, the patterned conductive coating comprising an interconnect system and a plurality of shielding structures;

wherein each of the plurality of shielding structures comprises a localized grounded shielding structure that is separate from other shielding structures and that conforms to a corresponding circuit component so as to provide individualized protection thereto, with each shielding structure configured to protect its respective circuit component from radio frequency (RF) interference, electromagnetic (EM) interference, and electrostatic discharge; and wherein the plurality of shielding structures are formed discontinuous from one another such that the plurality of shielding structures do not cover an entirety of the dielectric coating; and at least one thru silicon via structure extending out from the surface of the electrical system and extending out through the dielectric coating and into the patterned conductive coating.

11. The patterned conformal structure of claim 10 wherein the electrical system comprises one of a printed circuit board (PCB), a flex PCB, a rigid flex PCB, and a module.

12. The patterned conformal structure of claim 11 further comprising a surface mount package positioned on the patterned metallic coating, the surface mount package being electrically connected to one of the patterned conductive coating and the circuit components by the package feed-through structure or the thru silicon via structure.

13. The patterned conformal structure of claim 12 wherein the surface mount package comprises one of a capacitor, a resistor, an inductor, and a semiconductor package.

14. The patterned conformal structure of claim 10 further comprising:
a secondary dielectric coating positioned on the patterned conductive coating and configured to conform thereto, the secondary dielectric coating having at least two openings therein positioned over the patterned conductive coating; and a secondary patterned conductive coating layered on the secondary dielectric coating and on the patterned conductive coating at locations corresponding to the at least two openings in the secondary dielectric coating, such that an electrical connection is formed between the secondary patterned conductive coating and the patterned conductive coating;

wherein the dielectric coating, patterned conductive coating, secondary dielectric coating, and secondary patterned conductive coating form a multi-layer interconnect system on the electrical system to provide additional planes of component interconnect, shielding, or power and ground planes.

15. The patterned conformal structure of claim 14 further comprising at least one of an embedded die, an RF antennae, and a thin film passive device positioned on the secondary dielectric coating, wherein the at least one of the embedded die, the RF antennae, and the thin film passive device is electrically connected to at least one of the electrical system and a circuit component of the electrical system by way of the secondary patterned conductive coating and a thru silicon via structure.

16. The patterned conformal structure of claim 10 wherein the surface of the electrical system comprises at least one of a front surface having circuit components mounted thereon and a back surface.

17. The patterned conformal structure of claim 10 wherein the patterned conductive coating further comprises a thermal pathway configured to dissipate heat in the electrical system.

* * * * *